United States Patent
Ryu

(10) Patent No.: US 8,648,957 B2
(45) Date of Patent: Feb. 11, 2014

(54) CAMERA MODULE COMPRISING A LENS ASSEMBLY AND A SENSOR ASSEMBLY AND MANUFACTURING METHOD THEREOF

(75) Inventor: Chung Sang Ryu, Ansan-si (KR)

(73) Assignee: LG Innotek Co., Ltd., Seoul (KR)

( * ) Notice: Subject to any disclaimer, the term of this patent is extended or adjusted under 35 U.S.C. 154(b) by 436 days.

(21) Appl. No.: 12/528,957

(22) PCT Filed: Sep. 29, 2008

(86) PCT No.: PCT/KR2008/005740
§ 371 (c)(1),
(2), (4) Date: Aug. 27, 2009

(87) PCT Pub. No.: WO2009/041794
PCT Pub. Date: Apr. 2, 2009

(65) Prior Publication Data
US 2010/0177237 A1    Jul. 15, 2010

(30) Foreign Application Priority Data

Sep. 27, 2007  (KR) ................. 10-2007-0097232
Sep. 26, 2008  (KR) ................. 10-2008-0094440

(51) Int. Cl.
*H04N 5/225*      (2006.01)
*H01J 5/02*       (2006.01)

(52) U.S. Cl.
USPC ............ 348/340; 348/374; 250/239; 257/433

(58) Field of Classification Search
USPC .................... 348/374; 250/239; 257/433–434
See application file for complete search history.

(56) References Cited

U.S. PATENT DOCUMENTS

| | | | | |
|---|---|---|---|---|
| 6,610,166 | B1 * | 8/2003 | Harden et al. ................ | 156/242 |
| 6,794,218 | B2 * | 9/2004 | Barton et al. ................... | 438/73 |
| 7,535,509 | B2 | 5/2009 | Takayama | |
| 7,564,496 | B2 * | 7/2009 | Wolterink et al. ............ | 348/340 |
| 7,791,184 | B2 * | 9/2010 | Wood et al. .................... | 257/680 |
| 8,153,957 | B2 * | 4/2012 | Feldman et al. ............. | 250/239 |
| 8,233,757 | B2 * | 7/2012 | Kathman et al. ................ | 385/14 |
| 2005/0020328 | A1 | 1/2005 | Linder | |
| 2006/0132644 | A1 * | 6/2006 | Shangguan et al. .......... | 348/374 |
| 2006/0197862 | A1 * | 9/2006 | Lung ............................. | 348/335 |
| 2007/0275505 | A1 | 11/2007 | Wolterink et al. | |
| 2008/0251707 | A1 * | 10/2008 | Kathman et al. ............. | 250/239 |
| 2009/0008729 | A1 * | 1/2009 | Yang et al. .................... | 257/432 |

FOREIGN PATENT DOCUMENTS

| | | |
|---|---|---|
| JP | 03-030581 A | 2/1991 |
| JP | 1997-080590 A | 3/1997 |
| JP | 2004-233482 A | 8/2004 |
| JP | 2005-312002 A | 11/2005 |
| JP | 2006-005211 A | 1/2006 |
| JP | 2006-246461 A | 9/2006 |
| KR | 10-2004-0077057 A | 9/2004 |
| WO | WO-2004-027880 A2 | 4/2004 |
| WO | WO-2005/020328 A1 | 3/2005 |

\* cited by examiner

*Primary Examiner* — Ngoc-Yen Wu
(74) *Attorney, Agent, or Firm* — Saliwanchik, Lloyd & Eisenschenk

(57) ABSTRACT

Disclosed is a camera module. The camera module includes a lens assembly including a wafer level optics lens (WLO), and a sensor assembly on which the lens assembly is mounted through a surface mount technology (SMT). In the camera module, a lens is directly mounted on a sensor die through the SMT, so that the manufacturing process can be simplified and the manufacturing cost can be reduced. A height of the camera module is lowered, so that a slim camera module can be realized.

11 Claims, 3 Drawing Sheets

CAMERA MODULE COMPRISING A LENS ASSEMBLY AND A SENSOR ASSEMBLY AND MANUFACTURING METHOD THEREOF

CROSS-REFERENCE TO RELATED APPLICATION

This application is the U.S. national stage application of International Patent Application No. PCT/KR2008/005740, filed Sep. 29, 2008, the disclosure of which is hereby incorporated by reference in its entirety.

TECHNICAL FIELD

The present embodiment relates to a camera module.

BACKGROUND ART

Recently, as camera modules have been extensively installed in mobile communication terminals such as a portable phone and a personal digital assistant (PDA), small-size, slim, and light-weight camera modules have been gradually required.

However, when manufacturing camera modules, a product yield is lowered due to the repeated manufacturing process. Accordingly, material cost and manufacturing cost may be increased.

In addition, a height of a lens must be adjusted in order to focus the lens on a subject. Since a holder fixing the lens is weak against moisture, focusing may be blurred.

DISCLOSURE OF INVENTION

Technical Problem

The embodiment provides a camera module capable of simplifying the manufacturing process and the manufacturing cost.

Technical Solution

According to the embodiment, a camera module includes a lens assembly including a wafer level optics lens (WLO), and a sensor assembly on which the lens assembly is mounted through a surface mount technology (SMT).

Advantageous Effects

In the camera module according to the embodiment, a lens is directly mounted on a sensor die through a surface mount technology (SMT), so that the manufacturing process of the camera module can be simplified and the manufacturing cost can be reduced.

In addition, camera module may be made to have a height lowered to design a slim camera module.

MODE FOR THE INVENTION

Figure 1:
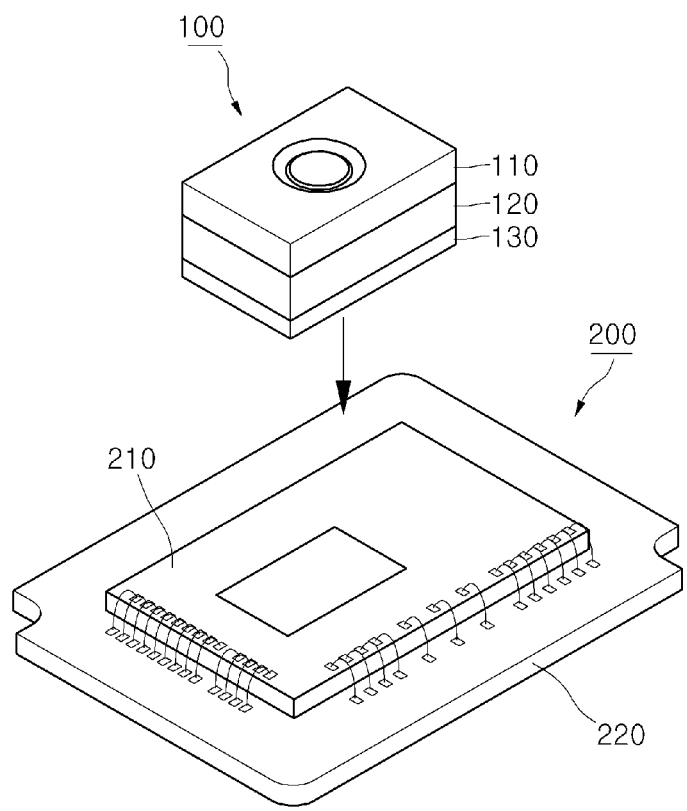
FIG. 1 is a view showing a camera module according to the embodiment.

FIG. 1 is a view showing a camera module according to the embodiment.

As shown in FIG. 1, the camera module includes a lens assembly 100 and a sensor assembly 200.

The lens assembly 100 includes a wafer level optics (WLO) lens formed by stacking a plurality of wafers. The lens assembly 100 includes a first lens 110, a second lens 120, and a cover plate 130.

Although the lens assembly 100 includes two lenses of the first and second lenses 110 and 120, the embodiment is not limited thereto, but the lens assembly 100 may include at least one lens.

Since the lens assembly 100 is mounted on the sensor assembly 200 through a surface mount technology (SMT), the first and second lenses 110 and 120 constituting the lens assembly 100 may include a heat-resistance material capable of enduring a high temperature.

Since the lens assembly 100 includes the heat-resistance material, when a camera module including the lens assembly 100 is mounted on a mobile communication terminal such as a portable phone or a personal display assistant (PDA), a reflow process can be performed.

The lens assembly 100 includes the cover plate 130 provided at a lower portion thereof, the second lens 120 provided on the cover plate 130, and the first lens 110 provided on the second lens 120.

The first and second lenses 110 and 120 of the lens assembly 100 are manufactured by using a lens wafer, and the cover plate 130 is manufactured by using a cover plate wafer.

The cover plate 130 is interposed between the second lens 120 and the sensor assembly 200 in order to adjust a focus, and includes a transparent material such as glass.

In this case, a thickness of the cover plate 130 is adjusted such that a focus between the lens assembly 100 and the sensor assembly 200 can be adjusted.

The lens assembly 100 is mounted on the sensor assembly 200 through the SMT.

The sensor assembly 200 includes a sensor die 210 and a printed circuit board (PCB) 220.

The sensor assembly 200 includes the PCB 220 and the sensor die 210 mounted on the PCB 220, and the lens assembly 100 is stacked on the sensor die 210.

The PCB 220 is provided on a bottom surface thereof with a pad used to electrically connect surface mount devices (SMDs) as well as the lens assembly. The SMDs can be directly mounted on the PCB 220 due to the pad.

The sensor die 210 is fabricated by sawing a sensor die wafer.

Figure 2:
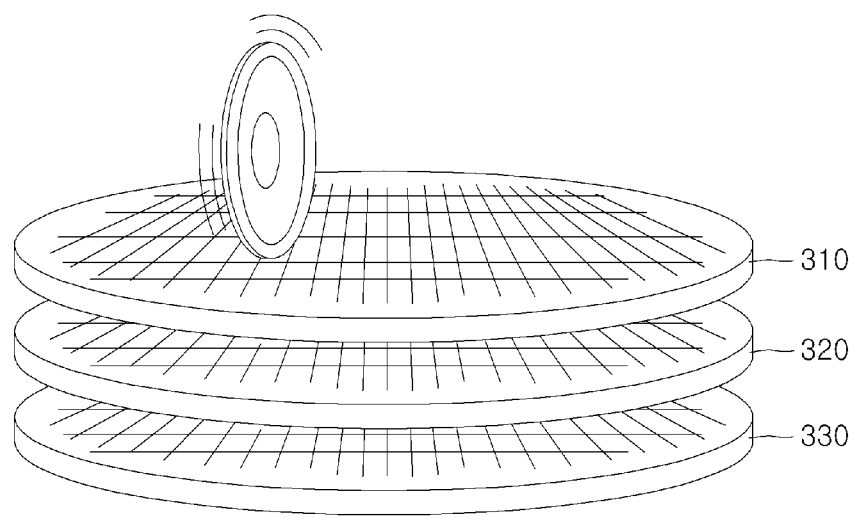
FIG. 2 is a view showing a lens wafer and a cover plate wafer according to the embodiment.

FIG. 2 is a view showing the lens wafer and the cover plate wafer, particularly, a first lens wafer 310, a second lens wafer 320, and a cover plate wafer 330.

In order to manufacture the lens assembly 100, after sequentially stacking the second lens wafer 320 and the first lens wafer 310 on the cover plate wafer 330, the first lens wafer 310, the second lens wafer 320, and the cover plate wafer 330 are sawed.

When the second lens wafer 320 and the first lens wafer 310 are sequentially stacked on the cover plate wafer 330, bonding may be temporarily performed with respect to the second lens wafer 320, the first lens wafer 310, and the cover plate wafer 330 in order to fix the first and second lens wafers 310 and 320 and the cover plate wafer 330.

Figure 3:
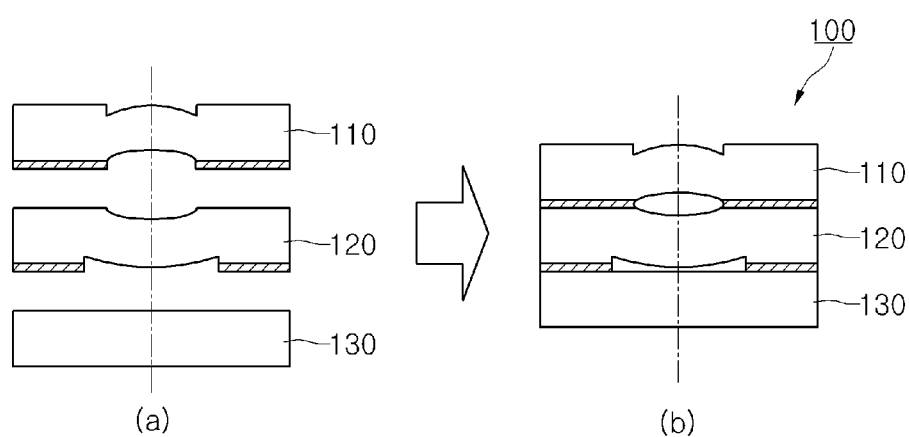
FIGS. 3A and 3B are a view showing a lens assembly according to the embodiment.

FIGS. 3A and 3B are a view showing the lens assembly 100 according to the embodiment.

In particular, FIGS. 3A and 3B are views showing processes to manufacture the WLO lens through the SMT. The WLO lens is manufactured through the processes shown in FIG. 3A and FIG. 3B.

As shown in FIG. 3A, the first lens wafer 310, the second lens wafer 320, and the cover plate 330 are sawed, thereby forming the first lens 110, the second lens 120, and the cover plate 130.

As shown in FIG. 3b, the first lens 110, the second lens 120, and the cover plate 130 are bonded by using a bonding material 140, thereby manufacturing the lens assembly 100. The bonding material 140 may include epoxy.

When the first and second lenses 110 and 120 and the cover plate 130 are formed, the lens assembly 100 may be designed by taking into consideration a thickness of the bonding material 140.

According to the embodiment, since the lens assembly 100 is realized by using the WLO lens, an additional lens adjustment process is not required. Therefore, the following process can be simplified, and product damage can be previously prevented.

In addition, since the lens assembly 100 can be produced as a module for the SMD, mass production can be achieved and workability can be easily improved.

Figure 4:
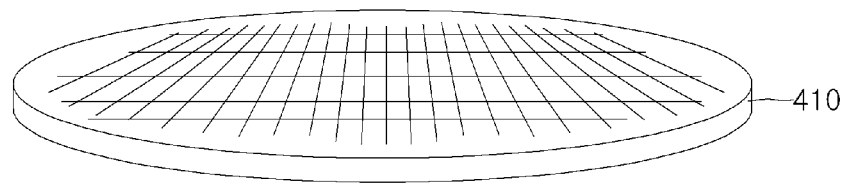
FIG. 4 is a view showing a sensor die wafer according to the embodiment.

FIG. 4 is a view showing a sensor die wafer 410 according to the embodiment. As shown in FIG. 4, the sensor die wafer 410 is sawed, thereby producing the sensor die 210.

Then, the sensor die 210 is bonded to the PCB 220.

Figure 5:
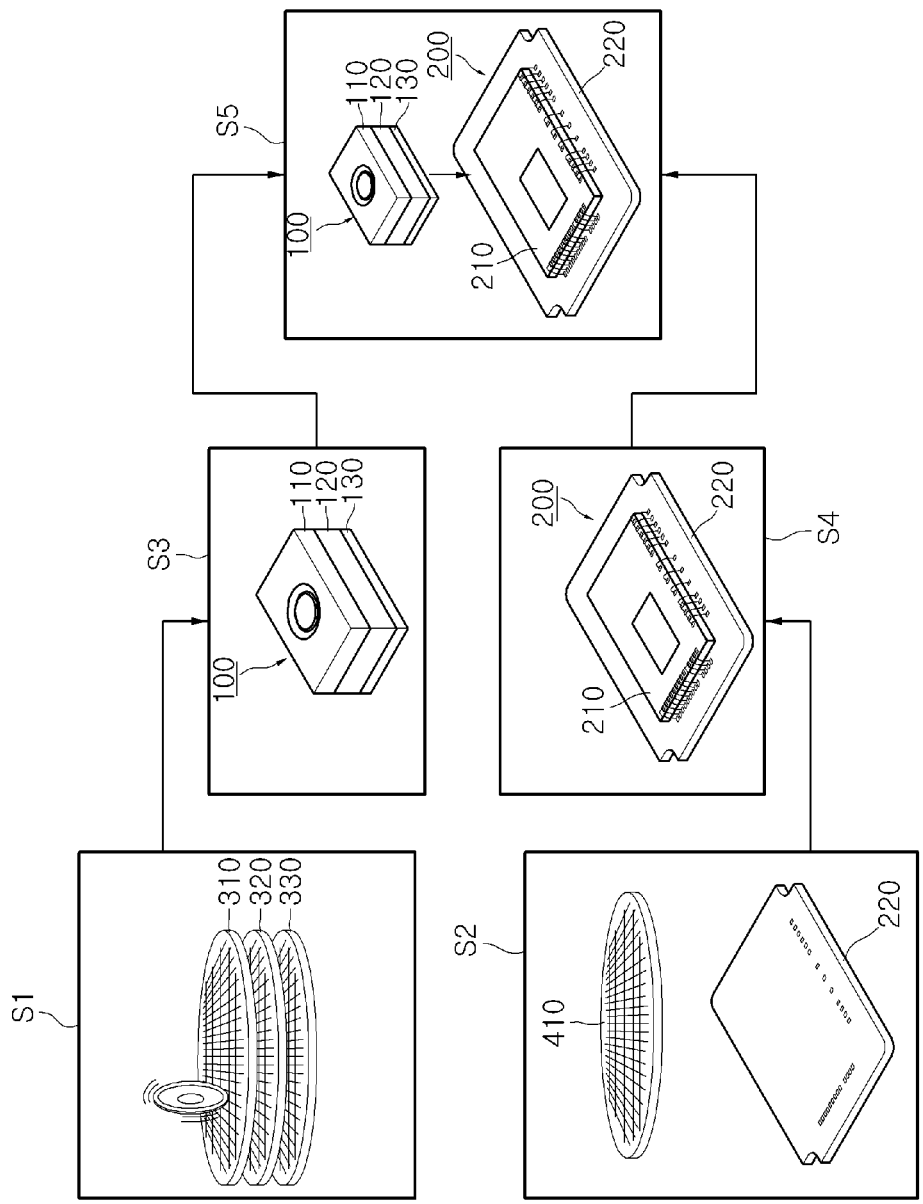
FIG. 5 is a view showing the manufacturing process of the camera module according to the embodiment.

FIG. 5 is a view showing the manufacturing process of the camera module according to the embodiment.

Hereinafter, the manufacturing process of the camera module will be summarized with reference to FIG. 5.

First, the first lens wafer 310, the second lens wafer 320, and the cover plate 330 are sawed, thereby producing the first lens 110, the second lens 120, and the cover plate 130 (step S1).

Then, the first lens 110, the second lens 120, and the cover plate 130 are bonded, thereby manufacturing the lens assembly 100 that is a WLO lens (step S3).

Meanwhile, in order to manufacture the sensor assembly 200, the sensor die wafer 410 is sawed to produce the sensor die 210, and the PCB 220 is prepared (step S2).

Subsequently, the sensor die 210 is bonded to the PCB 220 (step S4).

Then, the lens assembly 100 manufactured through the above method is mounted on the sensor assembly 200 through the SMT, thereby manufacturing the camera module (step S5).

As described above, according to the embodiment, since the lens assembly 100 is directly stacked on the sensor assembly 200 through the SMT, the camera module may be designed to have a height lowered by 30% relative to a height of a conventional camera module. In addition, the manufacturing process of the camera module can be simplified, and the manufacturing cost can be reduced.

In addition, since the lens assembly 100 is realized by using the WLO lens so that an additional lens adjustment is not required, the following process can be simplified and the product damage can be previously prevented.

INDUSTRIAL APPLICABILITY

The embodiment is adaptable for a camera module.
The invention claimed is:
1. A camera module comprising:
a lens assembly including a wafer level optics (WLO) lens; and
a sensor assembly on which the lens assembly is mounted,
wherein the sensor assembly includes a printed circuit board (PCB) and a sensor die mounted on the printed circuit board, the sensor die on which the lens assembly is stacked,
wherein the lens assembly comprises a cover plate, a first lens on the cover plate, and a second lens on the first lens, and
wherein a bottom surface of the cover plate is in contact with a top surface of the sensor die.
2. The camera module of claim 1, wherein the first lens, the second lens, and the cover plate are bonded.
3. The camera module of claim 1, wherein the wafer level optics lens includes a heat-resistance material.
4. The camera module of claim 1, wherein the lens assembly includes the cover plate for focusing.
5. The camera module of claim 4, wherein a thickness of the cover plate is adjusted to adjust a focus of a lens constituting the lens assembly.
6. The camera module of claim 1, wherein the lens assembly is manufactured by stacking at least one lens wafer and a cover plate wafer and then sawing the lens wafer and the cover plate wafer.
7. The camera module of claim 1, wherein the lens assembly is formed by bonding a lens wafer and a cover plate, which are formed through a sawing process, to each other.
8. The camera module of claim 1, wherein the lens assembly includes a cover plate provided at a lower portion thereof, a second lens provided on the cover plate, and a first lens provided on the second lens.
9. The camera module of claim 1, wherein the PCB includes a pad electrically connecting surface mount devices (SMDs) as well as the lens assembly.
10. The camera module of claim 1, wherein the sensor die is manufactured by sawing a sensor die wafer.
11. A camera module comprising:
a lens assembly including a wafer level optics (WLO) lens; and
a sensor assembly on which the lens assembly is mounted;
wherein the lens assembly includes a cover plate,
wherein the cover plate is interposed between a lens of the lens assembly and the sensor assembly,
wherein the sensor assembly includes a printed circuit board (PCB) and a sensor die mounted on the printed circuit board, the sensor die on which the lens assembly is stacked,
wherein a thickness of the cover plate is adjusted, thereby adjusting focus of a lens of the lens assembly,
wherein the lens assembly is formed by stacking and bonding a first lens, a second lens, and a cover plate,
wherein the first lens, the second lens, and the cover plate are formed by a cutting process,
wherein the sensor assembly is formed by mounting the sensor die on the printed circuit board,
wherein the WLO lens includes a heat resistant material,
wherein, in the lens assembly, the cover plate is disposed at a lower portion of the lens assembly, the second lens is disposed on the cover plate, and the first lens is disposed on the second lens,
wherein the PCB is provided with a pad to electrically connect a surface mount device (SMD) together with the lens assembly,
wherein the sensor die is manufactured by sawing a sensor die wafer.

* * * * *